United States Patent
Karlquist et al.

(10) Patent No.: US 9,721,759 B1
(45) Date of Patent: Aug. 1, 2017

(54) SYSTEM AND METHOD FOR DISTRIBUTING RF POWER TO A PLASMA SOURCE

(71) Applicant: AIXTRON SE, Herzogenrath (DE)

(72) Inventors: Richard Keith Karlquist, Galt, CA (US); Stephen Edward Savas, Pleasanton, CA (US); Robert Eugene Weisse, San Jose, CA (US)

(73) Assignee: AIXTRON SE, Herzogenrath (DE)

( * ) Notice: Subject to any disclaimer, the term of this patent is extended or adjusted under 35 U.S.C. 154(b) by 0 days.

(21) Appl. No.: 15/090,486

(22) Filed: Apr. 4, 2016

(51) Int. Cl.
*H05B 31/26* (2006.01)
*H01J 37/32* (2006.01)

(52) U.S. Cl.
CPC .. *H01J 37/32183* (2013.01); *H01J 37/32091* (2013.01); *H01J 37/32128* (2013.01); *H01J 2237/327* (2013.01); *H01J 2237/3323* (2013.01)

(58) Field of Classification Search
CPC .... H01J 65/046; H01J 37/32082; H01J 37/20; H01J 37/321; H01J 37/32091; G06F 1/181; H05H 1/46; H04B 1/0064
USPC ............... 315/248; 118/50.1, 723 I, 723 MP, 118/723 E; 333/133; 156/643.1, 345.37, 156/345.53, 345.25, 345.44
See application file for complete search history.

(56) References Cited

U.S. PATENT DOCUMENTS

| | | | |
|---|---|---|---|
| 4,266,162 A * | 5/1981 | McNeill | H01J 65/046 315/248 |
| 4,887,005 A | 12/1989 | Rough et al. | |
| 5,057,185 A * | 10/1991 | Thomas, III | H01J 37/32082 118/50.1 |
| 5,261,962 A | 11/1993 | Hamamoto et al. | |
| 5,609,690 A | 3/1997 | Watanabe et al. | |
| 5,653,811 A * | 8/1997 | Chan | H01J 37/20 |
| 5,733,511 A | 3/1998 | De Francesco | |
| 5,907,221 A * | 5/1999 | Sato | H01J 37/321 118/723 MP |
| 5,981,899 A | 11/1999 | Perrin et al. | |
| 6,552,297 B2 | 4/2003 | Blonigan et al. | |
| 6,642,661 B2 * | 11/2003 | Strang | H01J 37/32091 118/723 R |
| 6,661,657 B1 * | 12/2003 | Banton | G06F 1/181 165/104.33 |

(Continued)

FOREIGN PATENT DOCUMENTS

DE 4242894 A1 6/1994

*Primary Examiner* — Douglas W Owens
*Assistant Examiner* — Wei Chan
(74) *Attorney, Agent, or Firm* — Ascenda Law Group, PC

(57) ABSTRACT

Described herein are techniques for supplying radio frequency (RF) power to a large area plasma source so as to produce a plasma that is substantially uniform in two spatial dimensions. The RF power may be supplied by a power supply system, which may comprise a RF source and a distribution network. The distribution network may comprise a matching network, and a branching circuit that divides the RF power into several branches. Each of the branches of the distribution network may include a phase shifter that shifts the RF signal (which carries the RF power) by an odd multiple of 90°, and a blocking filter which blocks any harmonics and other unwanted frequencies which are reflected from a plasma source. The output of the branches may be coupled to feed points that are spatially distributed over the one or more electrodes of the plasma source.

16 Claims, 4 Drawing Sheets

(56) References Cited

U.S. PATENT DOCUMENTS

| | | | |
|---|---|---|---|
| 6,779,482 B2 | 8/2004 | Sakai et al. | |
| 6,884,635 B2 * | 4/2005 | Parsons | H01J 37/32082 |
| | | | 118/723 E |
| 7,042,311 B1 * | 5/2006 | Hilliker | H01J 37/32082 |
| | | | 333/133 |
| 7,141,516 B2 | 11/2006 | Kawamura et al. | |
| 7,164,236 B2 * | 1/2007 | Mitrovic | H01J 37/32009 |
| | | | 156/345.44 |
| 7,205,034 B2 | 4/2007 | Kawamura et al. | |
| 7,319,295 B2 | 1/2008 | Mashima et al. | |
| 7,342,361 B2 | 3/2008 | Ellingboe | |
| 7,811,410 B2 | 10/2010 | Leming et al. | |
| 8,298,625 B2 | 10/2012 | Stimson et al. | |
| 8,409,991 B2 | 4/2013 | Jost et al. | |
| 8,444,806 B2 | 5/2013 | Miyake et al. | |
| 9,161,428 B2 * | 10/2015 | Collins | H05H 1/46 |
| 9,461,674 B2 * | 10/2016 | Yarga | H04B 1/0064 |
| 2005/0173070 A1 | 8/2005 | Lee | |
| 2014/0193978 A1 | 7/2014 | Cho et al. | |

* cited by examiner

SYSTEM AND METHOD FOR DISTRIBUTING RF POWER TO A PLASMA SOURCE

FIELD OF THE INVENTION

The present invention relates to systems and methods for distributing radio frequency (RF) power to electrodes of a large area (or linear) plasma source, and more particularly relates to simultaneously distributing the RF power to a plurality of the electrodes and distributing the RF power from one or more RF sources.

BACKGROUND

Plasma processing of large area substrates (e.g., more than two meters by two meters in size) is needed for a cost-effective manufacturing of display screens, thin film photovoltaic panels, light filters for windows and other large area mass-market products. However, to produce a substrate with properties that are the same over nearly the entire area of the substrate (which is necessary for good product yields), the plasma involved in the processing of the substrate should have approximately constant properties over its full extent in the processing chamber.

When high frequency RF power (at frequencies of 13.56 MHz and above) is employed to excite the plasma, the electrical potentials on the electrode (i.e., powered electrode) for forming this plasma may have a quarter-wavelength on the same order of magnitude as the size of the electrode. Consequently, a substantial variation in the amplitude of the RF voltage and current may be present across the electrode, causing a non-constant power injection into the plasma along the length of the electrode. This results from the fact that RF currents propagate as electromagnetic waves on the surface of the metal electrode, in much the same way as a loaded transmission line. The electrical power may be absorbed into the plasma both capacitively and inductively due to shunt or induced currents in the plasma as EM waves propagate along the electrode surface. This variation in the amplitude of the RF voltage across an electrode has been shown to be substantial for parallel plate electrodes when the power is provided at a single contact point on an electrode that extends over the full area of the plasma. For linear electrodes, larger variations occur when power is provided at a single contact point on a linear electrode that is larger than a small fraction of a wavelength. Such non-uniformity in the RF voltage amplitude (and similarly in the RF current) often results in a significant non-uniformity of the process over the surface of the substrate, which is not desirable.

SUMMARY OF THE INVENTION

In accordance with one embodiment of the invention, RF power (at one or more frequencies) and AC electric current is evenly divided and then distributed (with a high degree of stability) in equal amounts to multiple contact points on parallel plate or linear electrodes. Such even distribution of current enables the formation of plasma with a high degree of uniformity, which in turn enables a high yield in the mass production on large substrates of electrical components and devices (e.g., display screens, thin film photovoltaic panels, etc.). By evenly and stably dividing and distributing the current from power sources, a smaller number of power sources and matching networks are needed, which improves system reliability and lowers system cost. For example, reliability improves because each RF source or matching network has roughly the same mean time between failures (MTBF) regardless of size, so that a power system with fewer RF sources and matching networks will have fewer points to fail and thus a proportionately larger MTBF (i.e., a larger MTBF being more desirable).

In accordance with one embodiment of the invention, the power supply system is scalable to a large number (e.g., greater than 30) of feeds (i.e., a feed being an electrical connection) to a substantial number of electrodes (e.g., greater than 8) for one or more RF sources and at a wide range of drive frequencies (e.g., from about 100 kHz to over 100 MHz). The power supply system must maintain an even and stable distribution of the RF current even under a substantial range of power delivered to each of the feeds and under a substantial range of plasma conditions. This stability means that the current delivered to each feed is constant, even if there is a substantial variation in the impedance of an electrode situated in a plasma source or processing chamber. Such variations may be due to the scanning of a substrate or variation in local properties (e.g., surface variations in the substrate or structure around the substrate) due to using a photo mask. The even current distribution results in a substantially constant power density of the plasma along the length and width of any plasma source and in all plasma sources, which in turn causes the rate of a deposition process to remain highly uniform and stable over time when a large area substrate is scanned within the one or more plasma sources.

In accordance with one embodiment of the invention, RF power output from one or more impedance matching networks is split among multiple feeds to one or multiple plasma sources. (A plasma source is sometimes called a plasma load, when the plasma source is viewed as a component in an electrical circuit.) This power distribution "splitter" provides parallel circuits for parallel current paths, each of which circuits may have a phase shifter and one or more blocking filters for blocking unwanted frequencies (e.g., frequencies provided by other supplies reflected from the plasma load and/or harmonics of the supply frequency). These parallel circuits may be constructed using inexpensive passive components (such as capacitors and inductors) that can be compact and whose temperature can be well controlled.

In accordance with one embodiment of the invention, the phase shifters typically are in a "pi" configuration, but also may be in a "T" configuration. With suitably chosen, passive reactive elements combined in a "pi" or "T" configuration, the output RF current delivered to the terminations (e.g., contact points on electrode(s)) will be equal, regardless of varying magnitudes of the terminating impedances. The inventors found surprisingly that this is the case even with the terminating impedances varying by more than an order of magnitude! Circuit properties may be tuned to provide the proper transformation properties for the current, preferably to shift its phase by odd multiples of 90°, where this multiple need not be the same for all feed points (i.e., feed points being contact points on the electrode(s)). The impedance of the phase shifter for each drive frequency may in some embodiments be within about +/−50% of the load impedance at that feed point at that drive frequency to produce the desired current transformation. "Pi" or "T" phase shifters are preferable to a phase shifter constructed using coaxial delay lines. In the latter case, very long coaxial delay lines would be needed for RF frequencies of 27.12 MHz and below, complicating the temperature control of the coaxial delay lines (which is needed to properly control the impedance of the coaxial delay lines).

In accordance with one embodiment of the invention, when multiple RF frequencies are used to drive the plasma source(s), one or more blocking filters are located in each of the branches after the phase shifter. The one or more blocking filters (which may be constructed from simple passive components) may prevent any unwanted frequencies from propagating from the plasma load through the filter to the RF source. The end of each branch from the distribution network for each RF frequency is then connected to the feed lines of an electrode. In one embodiment, multiple frequencies of power are provided to each feed line of each electrode. This results in the equal and highly stable distribution of power at multiple frequencies to multiple electrodes in multiple plasma sources.

In accordance with a preferred embodiment of the invention, the parallel current paths of the distribution network may be constructed using printed circuit (PC) boards (with simple and inexpensive passive components assembled thereon). These boards may be compact and stackable in a chassis of appropriate size where adequate space is provided between boards to allow airflow between same. The PC boards may be maintained at a stable operating temperature by air cooling fans so that substantial numbers (e.g., greater than or equal to 8) of such boards may be housed in a single splitter box to provide current at a large number of feed points to complex multi-plasma source configurations. Boards for up to hundreds of feed points could be housed and kept at a stable temperature in such a chassis. The phase shifters and blocking filters may have the same design for all feed points with common component values (e.g., capacitance and inductance values) for a given drive frequency and feed line impedance.

Regarding the application to multiple electrodes or plasma sources for which equal RF current is to be provided, several factors may determine the plasma density and rate of ionization and dissociation in a plasma. These factors include the gas density of the plasma, the gap size between the electrodes, and the RF current density across the powered electrode(s). Thus, if the RF current per electrode section (i.e., an electrode may be composed of several electrically isolated sections) is made the same for all sections, the plasma density and ionization/dissociation rates will be the same for all electrode sections, thereby providing a highly uniform process. It is noted that plasma is difficult to control by other passive means since both reactive and resistive parts of the impedance will generally drop as the power to the plasma is increased, which tends to provoke an instability in most approaches to current distribution where more current will then flow to electrodes or sources having lower impedances.

In summary, the advantages of one embodiment of the invention include:

(1) Simplified process control due to the use of a single RF source and matching network for each RF frequency, which may provide power to as many as ten or more plasma sources.

(2) The use of multiple plasma excitation frequencies for a single feed point of RF power, which helps avoids crosstalk, in which currents from one RF power supply are reflected into another RF power supply having a different frequency output, which would interfere with a stable operation of the plasma source.

(3) A highly stable distribution of RF power that does not drift during long processes.

(4) An improved reliability because fewer RF sources and matching networks are used, resulting in an increased system-level MTBF.

(5) The cost of the RF power supply system as a whole is also reduced.

These and other embodiments of the invention are more fully described in association with the drawings below.

DETAILED DESCRIPTION OF THE INVENTION

In the following detailed description of the preferred embodiments, reference is made to the accompanying drawings that form a part hereof, and in which are shown by way of illustration specific embodiments in which the invention may be practiced. It should be understood that other embodiments may be utilized and structural changes may be made without departing from the scope of the present invention. Description associated with any one of the figures may be applied to a different figure containing like or similar components/steps. While the sequence diagrams each present a series of steps in a certain order, the order of some of the steps may be changed.

Figure 1:
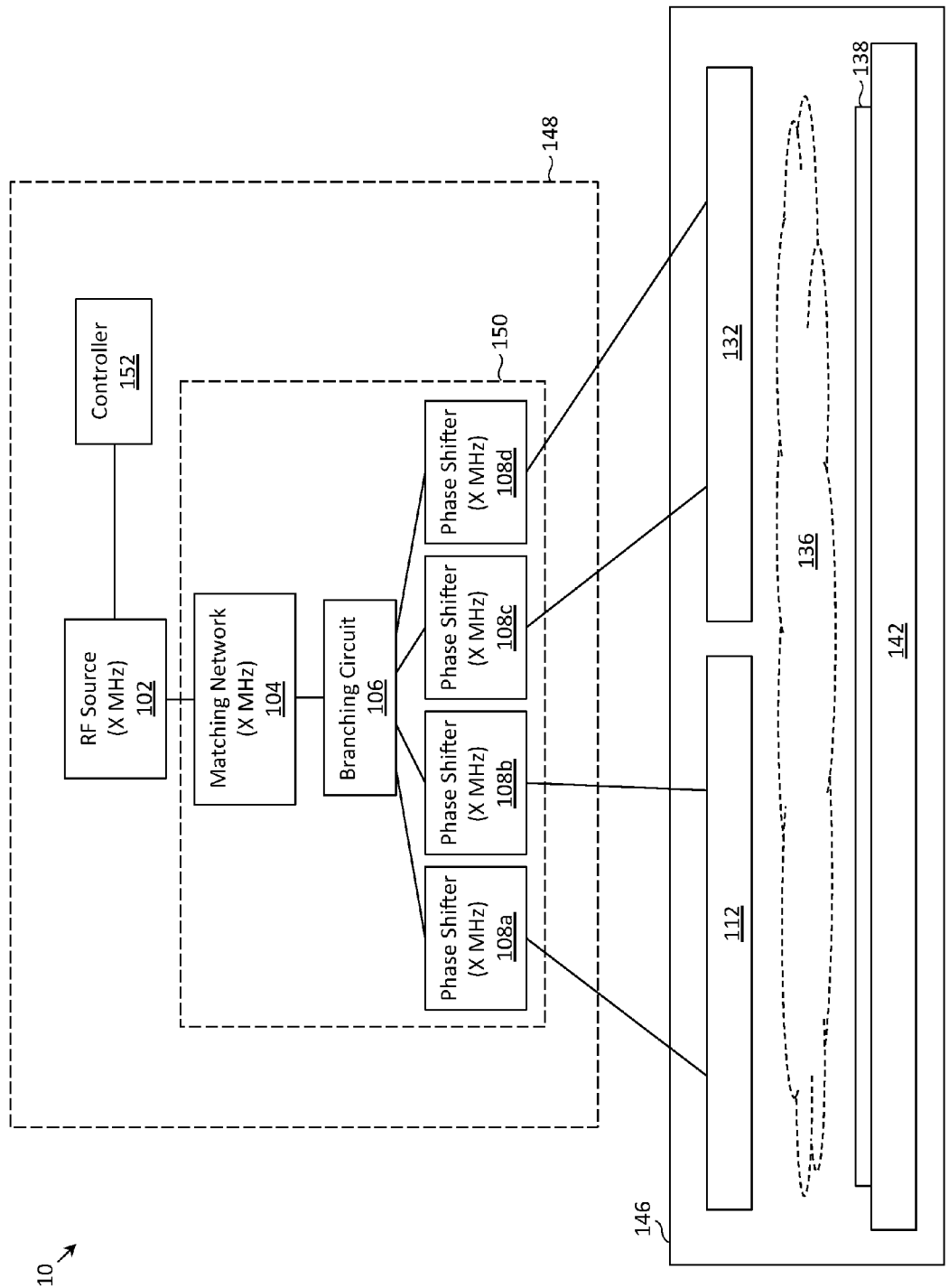
FIG. 1 depicts an apparatus for depositing at least one layer on a substrate, the apparatus comprising at least one RF source, in accordance with one embodiment of the invention.

FIG. 1 depicts apparatus 10 for depositing at least one layer on substrate 138, in accordance with one embodiment of the invention. Apparatus 10 may include electrodes 112, 132 and 142 situated within chamber 146, such electrodes configured to generate plasma or products of plasma decomposition within plasma region 136. Apparatus 10 may also include power supply system 148, which may be electrically coupled to electrodes 112 and 132. Power supply system 148 may comprise at least one RF source 102 configured to generate an RF signal at a first frequency (e.g., $\omega_1$ radians or equivalently, X MHz where $\omega_1=2\pi*X$ MHz), and distribution network 150 configured to distribute RF power from the RF source to the electrodes. Although not shown in detail, it should be recognized that apparatus 10 may further include elements for the introduction of one or more gasses (e.g., used to form a plasma in plasma region 136), vacuum pump or other evacuation means for chamber 146, and other features common to plasma deposition apparatus.

Distribution network 150 may comprise impedance matching network 104 configured to match the impedance of the plasma load, and branching circuit 106 configured to distribute the RF signal into the parallel branches of distribution network 150. Each of the branches may be coupled to one of electrodes 112 and 132. As shown, each branch may supply RF power to one feed point of one of the electrodes, and the feed points may be distributed over the surface of an electrode to provide better uniformity of the amplitude of the RF voltage and current across each of the electrodes.

Further, each of the branches may comprises a phase shifter (i.e., phase shifter 108a in the first branch, phase shifter 108b in the second branch, phase shifter 108c in the third branch and phase shifter 108d in the fourth branch). Each of the phase shifters may cause a phase shift of an odd multiple of 90° in the RF current at the first frequency, $\omega_1$. As a result of the phase shifters, the output RF current delivered to the terminations (e.g., contact points on electrode(s)) will be substantially equal, regardless of varying magnitudes of the terminating impedances. More details regarding the phase shifters are described with respect to FIGS. 3a and 3b below.

While electrodes 112 and 132 may be powered, electrode 142 may be grounded. Plasma within plasma region 136 may be formed between electrodes 112 and 142 and between electrodes 132 and 142. Electrodes 112 and 132 may be interpreted as segments of a larger electrode (such segments being electrically isolated from one another). An electrode that is segmented into smaller electrically isolated portions may provide better uniformity in the amplitude of the RF voltage and current amplitude across the electrodes (as compared to a non-segmented electrode of the same size). While plasma region 136 is depicted "above" substrate 138, this is for ease of illustration. In practice, it is understood that substrate 138 may be located within plasma region 136 in order to perform a deposition and/or etching process on the substrate. While not depicted, one or more gas sources may supply gas into chamber 146, and one or more gas exhausts may exhaust gas from chamber 146.

Figure 2:
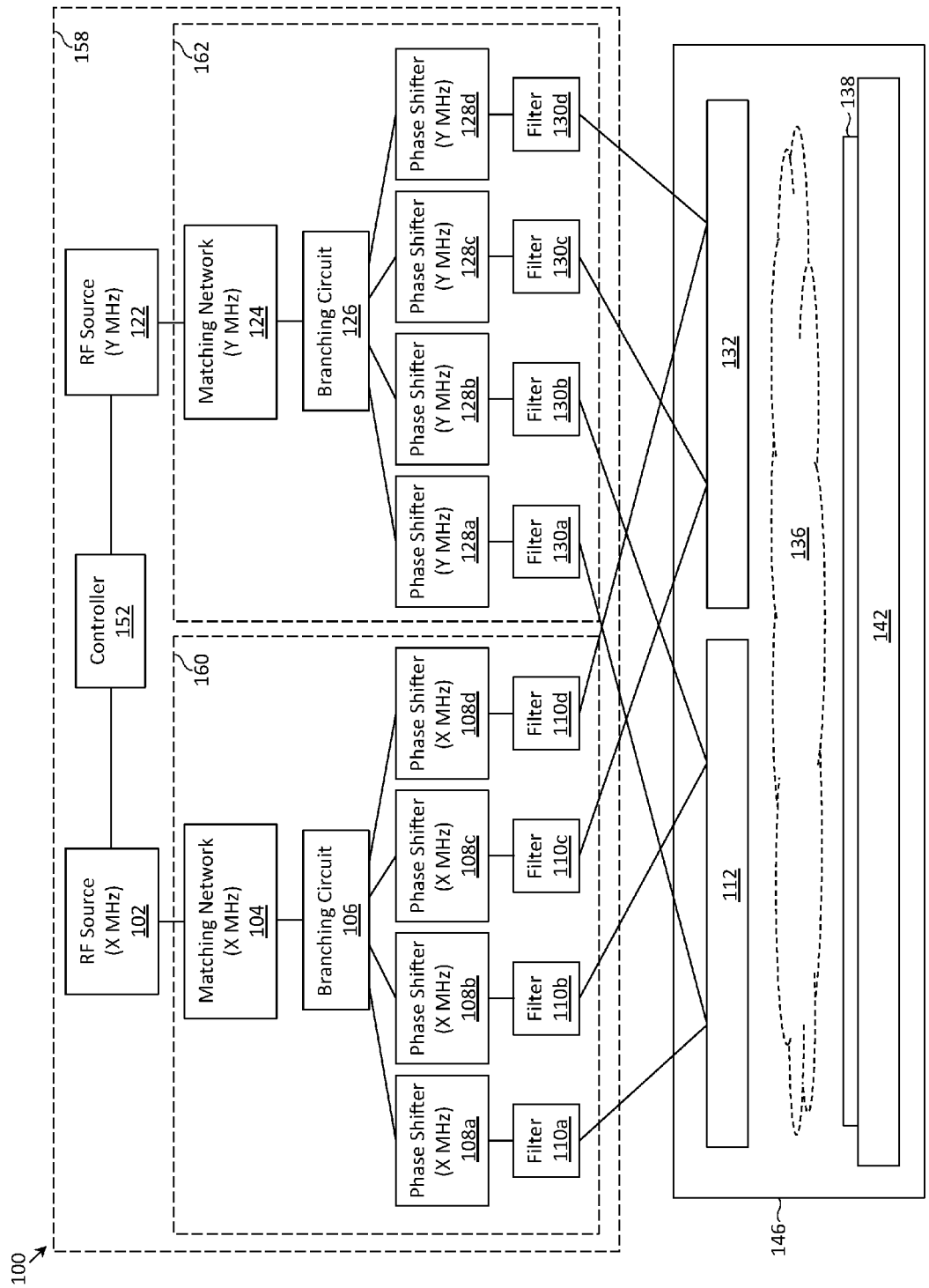
FIG. 2 depicts an apparatus for depositing at least one layer on a substrate, the apparatus comprising at least two RF sources, in accordance with one embodiment of the invention.

FIG. 2 depicts apparatus 100 for depositing at least one layer on substrate 138, in accordance with one embodiment of the invention. Apparatus 100 may include electrodes 112, 132 and 142 situated within chamber 146, such electrodes configured to generate plasma or products of plasma decomposition within plasma region 136. Apparatus 100 may also include power supply system 158, which may be electrically coupled to electrodes 112 and 132. Power supply system 158 may include first RF source 102 configured to generate an RF signal at a first frequency, $\omega_1$; second RF source 122 configured to generate an RF signal at a second frequency (e.g., $\omega_2$ radians or equivalently, Y MHz where $\omega_2=2\pi*Y$ MHz); first distribution network 160 configured to distribute RF power from first RF source 102 to one or more of electrodes 112, 132; and second distribution network 162 configured to distribute RF power from second RF source 122 to one or more of electrodes 112, 132.

First distribution network 160 may comprise impedance matching network 104 configured to match the impedance of the plasma load, and branching circuit 106 configured to distribute the RF signal of RF source 102 into the parallel branches of distribution network 160. Each of the branches may supply RF power to a feed point of one of the electrodes, and the feed points may be distributed over the surface of an electrode to provide better uniformity in the amplitude of the RF voltage and current across each of the electrodes.

Each of the branches of first distribution network 160 may comprise a phase shifter and a blocking filter (i.e., phase shifter 108a and blocking filter 110a in the first branch, phase shifter 108b and blocking filter 110b in the second branch, phase shifter 108c and blocking filter 110c in the third branch, and phase shifter 108d and blocking filter 110d in the fourth branch). Each of the phase shifters 108a, 108b, 108c and 108d may cause a phase shift of an odd multiple of 90° in the RF signal at the first frequency, $\omega_1$. Each of the blocking filters 110a, 110b, 110c and 110d may block at least the first harmonic of the first frequency (i.e., $2\omega_1$), as well as frequencies generated by other RF sources (e.g., RF source 122) in power supply system 158, thereby preventing power of other frequencies from interfering with RF source 102.

Second distribution network 162 may comprise impedance matching network 124 configured to match the impedance of the plasma load, and branching circuit 126 configured to distribute the RF signal of RF source 122 into the parallel branches of distribution network 162. Each of the branches may supply RF power to a feed point of one of the electrodes, and the feed points may be distributed over the surface of an electrode to provide better uniformity in the amplitude of the RF voltage and current across each of the electrodes.

Similarly, each of the branches of second distribution network 162 may comprise a phase shifter and a blocking filter (i.e., phase shifter 128a and blocking filter 130a in the first branch, phase shifter 128b and blocking filter 130b in the second branch, phase shifter 128c and blocking filter 130c in the third branch, and phase shifter 128d and blocking filter 130d in the fourth branch). Each of the phase shifters 128a, 128b, 128c and 128d may cause a phase shift of an odd multiple of 90° in the RF signal at the second frequency, $\omega_2$. Each of the blocking filters 130a, 130b, 130c and 130d may block at least the first harmonic of the second frequency (i.e., $2\omega_2$), as well as frequencies generated by other RF sources (e.g., RF source 102) in power supply system 158, thereby preventing power of other frequencies from interfering with RF source 122.

As a specific example, phase shifters 108a, 108b, 108c and 108d may be 90° phase shifters configured to operate at X MHz; phase shifters 128a and 128b may be 90° phase shifters configured to operate at Y MHz; and phase shifters 128c and 128d may be 270° phase shifters configured to operate at Y MHz. Further, each of filters 110a, 110b, 110c and 110d may comprise a filter configured to block an RF signal at 2X MHz and a filter configured to block an RF signal at Y MHz; and each of filters 130a, 130b, 130c and 130d may comprise a filter configured to block an RF signal at 2Y MHz and a filter configured to block an RF signal at X MHz.

The end of each branch from first distribution network 160 may be connected to one or more feed points of electrodes 112, 132. Similarly, the end of each branch from second distribution network 162 may be connected to one or more feed points of electrodes 112, 132. In one embodiment, two or more frequencies of power may be provided to each feed point of each electrode.

In one embodiment of the invention, phase shifters 108a, 108b, 108c and 108d and filters 110a, 110b, 110c and 110d may be located on a first PC board, and branching circuit 106 may provide RF signals to the first PC board via coaxial cables. Similarly phase shifters 128a, 128b, 128c and 128d and filters 130a, 130b, 130c and 130d may be located on a second PC board, and branching circuit 126 may provide RF signals to the second PC board via coaxial cables. Alternatively, phase shifters 108a, 108b, 108c, 108d, 128a, 128b, 128c and 128d and filters 110a, 110b, 110c, 110d, 130a, 130b, 130c and 130d may all be located on the same PC board.

In one embodiment of the invention, power supply system 158 comprises three major subsystems connected in series, each performing one of the three essential functions:

The first major subsystem may include branching circuits 106 and 126, which may be a PC board or a multi-connector branching structure, or branching structure with coaxial cables of equal length on the outputs. The branching circuits may provide power of a frequency or range of frequencies to parallel outputs of the branching circuits 106 and 126, each of the parallel outputs approximately having the same effective path length.

The second major subsystem may include phase shifters 108*a-d* and 128*a-d*, each of which cause the phase of the current along each output branch from the branching circuits to advance or regress by an odd multiple of 90° (as measured from the corresponding branching structure). The phase shifter for each branch in some embodiments may be constructed as a "pi" or "T" circuit (as shown below in FIG. 3) employing passive reactive elements, such as capacitors and inductors. Values for the passive reactive elements should be chosen to produce both the desired odd multiple of 90° phase shift, as well as having the desired impedance to match that of the plasma load associated with that part of the electrode (e.g., 112, 132) to which it is connected.

The third major subsystem may comprise one or more blocking filters (arranged in series) for each branch following the phase shifter (e.g., filters 110*a-d* and filters 130*a-d*). Each blocking filter may have a low impedance at the frequency that is desired to be passed (e.g., the frequency of a RF source), but a very high impedance at each of the unwanted frequencies. This filter in some embodiments may be an LC tank circuit (i.e., an inductor and a capacitor arranged in parallel) that is resonant at the frequency that is to be blocked. If not already apparent, an LC tank circuit has a very high impedance at the resonant frequency, resulting in the blocking of the resonant frequency.

It is noted that controller 152 may control the operation of RF sources 102 and 122 (e.g., control frequency, phase and/or amplitude of RF signal generated by the respective RF source).

Figure 3A:
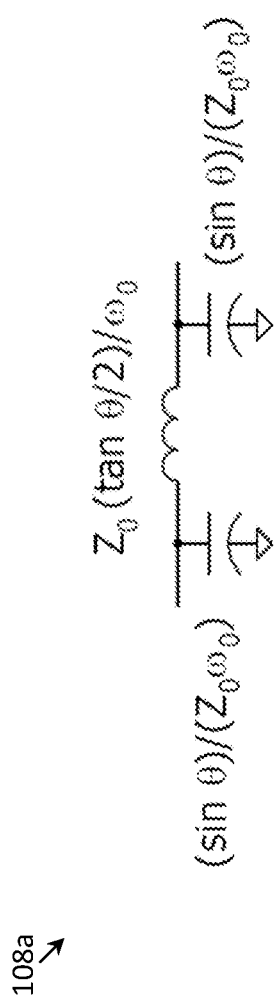
FIGS. 3a and 3b each depicts a phase shifting circuit, in accordance with one embodiment of the invention.
Figure 3B:
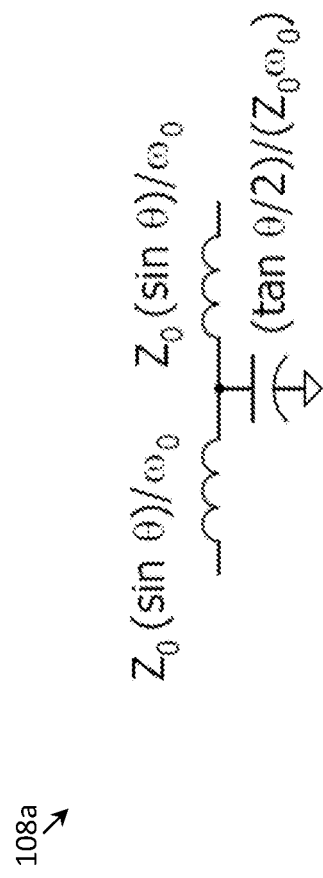

FIGS. 3*a* and 3*b* each depicts a phase shifting circuit, in accordance with one embodiment of the invention. FIG. 3*a* depicts a "pi" circuit, whereas FIG. 3*b* depicts a "T" circuit. To produce a 90° phase shift, one may set θ (in the mathematical expressions of FIG. 3) to 90°. Upon simplifying the mathematical expressions, one may calculate an inductance of $Z_o/\omega_o$ for the inductor(s) and a capacitance of $1/(Z_o\omega_o)$ for the capacitor(s), where $Z_o$ is the impedance of the plasma load associated with that part of the electrode (e.g., 112, 132) at $\omega_o$.

Figure 4:
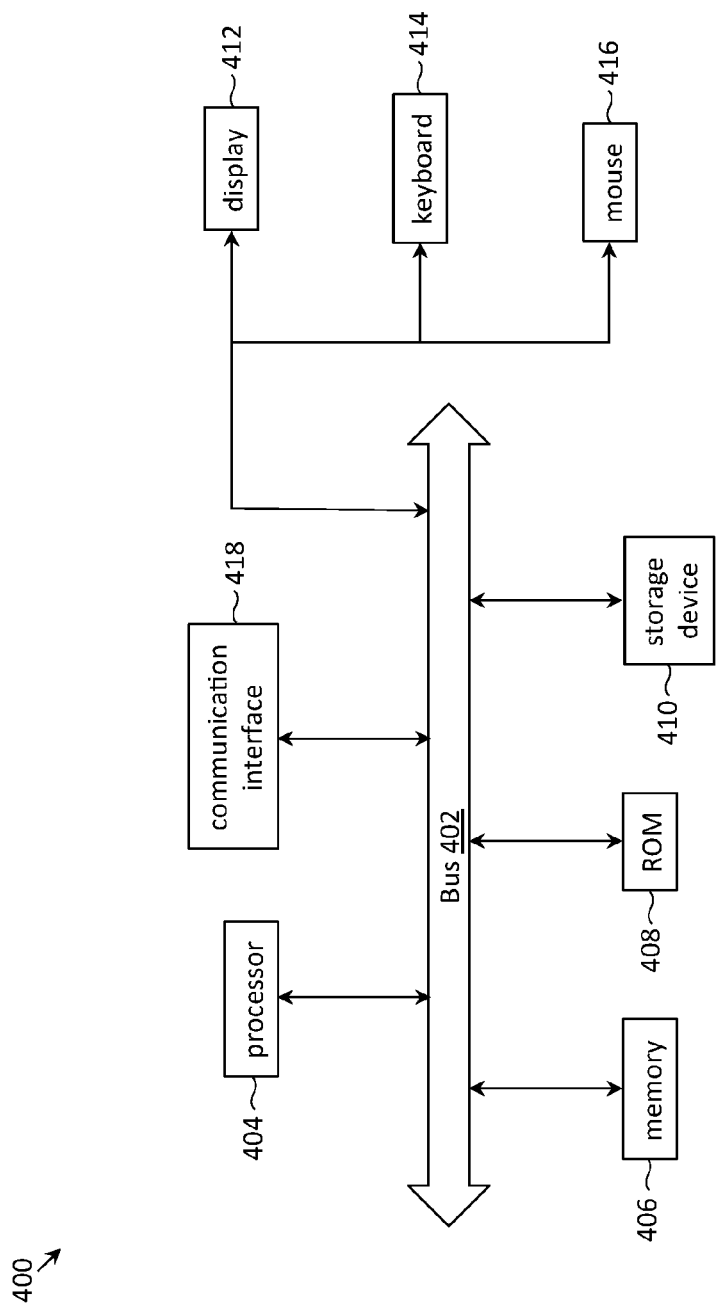
FIG. 4 depicts components of a computer system in which computer readable instructions instantiating the methods of the present invention may be stored and executed.

As noted above, aspects of the present invention involve the use of a controller which may be instantiated as a processor-based system with a processor-readable storage media having processor-readable instructions stored thereon. FIG. 4 provides an example of a system 400 that is representative of such a processor-based system. Note, not all of the various processor-based systems which may be employed in accordance with embodiments of the present invention have all of the features of system 400. For example, certain processor-based systems may not include a display inasmuch as the display function may be provided by a client computer communicatively coupled to the processor-based system or a display function may be unnecessary. Such details are not critical to the present invention.

System 400 includes a bus 402 or other communication mechanism for communicating information, and a processor 404 coupled with the bus 402 for processing information. System 400 also includes a main memory 406, such as a random access memory (RAM) or other dynamic storage device, coupled to the bus 402 for storing information and instructions to be executed by processor 404. Main memory 406 also may be used for storing temporary variables or other intermediate information during execution of instructions to be executed by processor 404. System 400 further includes a read only memory (ROM) 408 or other static storage device coupled to the bus 402 for storing static information and instructions for the processor 404. A storage device 410, which may be one or more of a floppy disk, a flexible disk, a hard disk, flash memory-based storage medium, magnetic tape or other magnetic storage medium, a compact disk (CD)-ROM, a digital versatile disk (DVD)-ROM, or other optical storage medium, or any other storage medium from which processor 404 can read, is provided and coupled to the bus 402 for storing information and instructions (e.g., operating systems, applications programs and the like).

System 400 may be coupled via the bus 402 to a display 412, such as a flat panel display, for displaying information to a user. An input device 414, such as a keyboard including alphanumeric and other keys, may be coupled to the bus 402 for communicating information and command selections to the processor 404. Another type of user input device is cursor control device 416, such as a mouse, a trackball, or cursor direction keys for communicating direction information and command selections to processor 404 and for controlling cursor movement on the display 412. Other user interface devices, such as microphones, speakers, etc. are not shown in detail but may be involved with the receipt of user input and/or presentation of output.

The processes referred to herein may be implemented by processor 404 executing appropriate sequences of processor-readable instructions stored in main memory 406. Such instructions may be read into main memory 406 from another processor-readable medium, such as storage device 410, and execution of the sequences of instructions contained in the main memory 406 causes the processor 404 to perform the associated actions. In alternative embodiments, hard-wired circuitry or firmware-controlled processing units (e.g., field programmable gate arrays) may be used in place of or in combination with processor 404 and its associated computer software instructions to implement the invention. The processor-readable instructions may be rendered in any computer language.

System 400 may also include a communication interface 418 coupled to the bus 402. Communication interface 418 may provide a two-way data communication channel with a computer network, which provides connectivity to the plasma processing systems discussed above. For example, communication interface 418 may be a local area network (LAN) card to provide a data communication connection to a compatible LAN, which itself is communicatively coupled to other computer systems. The precise details of such communication paths are not critical to the present invention. What is important is that system 400 can send and receive messages and data through the communication interface 418 and in that way communicate with other controllers, etc.

Thus, methods and systems for distributing RF power to a plasma source have been described. It is to be understood that the above-description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

A diagnostic system may be associated with the RF power distribution system described above. Said diagnostic system may include circuits or devices to make measurements of the voltage or current provided at any subset of the feed points to one or more electrodes. Said diagnostic system may additionally include a computer or control system and one or more software programs or firmware programs that may determine based on the measured voltage or current from one or more of the branches whether the system is operating properly. Said diagnostic software system may have as one of its functions to detect abnormal or undesirable conditions in the plasma. It may also determine what type of abnormal condition is occurring and either terminate the process or calculate what adjustment to the process conditions may rectify the abnormal condition. The control program for the diagnostic system may then make the adjustments and/or alert the operations staff as to the abnormal conditions.

What is claimed is:

1. An apparatus, comprising:
   at least two electrodes of a multi-electrode plasma device; and
   a power supply system, including at least a first radio frequency (RF) source and a second RF source, the first RF source having a first output frequency and the second RF source having a second output frequency differing from the first output frequency, the first RF source being electrically coupled through a first distribution network to the at least two electrodes, and the second RF source being electrically coupled through a second distribution network to the at least two electrodes,
   the first distribution network comprising:
      a first RF impedance matching network configured for the first output frequency; and
      a first branching circuit connected to the first RF impedance matching network, the first branching circuit having at least two branches, each branch of which is connected to a series circuit, each of the series circuits comprising an RF filter circuit and a phase shifter circuit connected in series, each of the RF filter circuits of the first distribution network substantially blocking power transmission at least at the second output frequency, and each of the phase shifter circuits of the first distribution network comprising three fixed-valued reactive elements arranged in a T or π configuration to provide a phase shift of one of the angles: 90°, 270° (=3×90°), 450° (=5×90°) and 630° (=7×90°) for RF power at the first output frequency; and
   the second distribution network comprising:
      a second RF impedance matching network configured for the second output frequency; and
      a second branching circuit connected to the second RF impedance matching network, the second branching circuit having at least two branches, each branch of which is connected to a series circuit, each of the series circuits comprising an RF filter circuit and a phase shifter circuit connected in series, each of the RF filter circuits of the second distribution network substantially blocking power transmission at least at the first output frequency, and each of the phase shifter circuits of the second distribution network comprising three fixed-valued reactive elements arranged in a T or π configuration to provide a phase shift of one of the angles: 90°, 270°, 450° and 630° for RF power at the second output frequency,
      wherein outputs from at least two of the series circuits, whose inputs are connected to the first branching circuit, are electrically connected to a plurality of connection points, including at least one feed to each of the at least two electrodes, and outputs from at least two of the series circuits, whose inputs are connected to the second branching circuit, are electrically connected to the plurality of connection points.

2. The apparatus of claim 1, wherein for a first and a second one of the phase shifter circuits of the first distribution network, a phase shift produced by the first phase shifter circuit and a phase shift produced by the second phase shifter circuit differ by approximately 180°.

3. The apparatus of claim 1, wherein for at least one of the RF filter circuits of the first distribution network, the RF filter circuit blocks a harmonic of the first output frequency in addition to blocking the second output frequency.

4. The apparatus of claim 1, wherein for at least one of the RF filter circuits of the first distribution network, the RF filter circuit blocks a harmonic of the second output frequency.

5. The apparatus of claim 1, wherein for at least one of the RF filter circuits of the second distribution network, the RF filter circuit blocks a harmonic of the second output frequency in addition to blocking the first output frequency.

6. The apparatus of claim 1, wherein the phase shifter circuits of the first distribution network and the phase shifter circuits of the second distribution network are located on a plurality of printed circuit (PC) boards.

7. The apparatus of claim 6, wherein the plurality of PC boards are housed in an air-cooled chassis.

8. An apparatus, comprising:
   at least two electrodes of a multi-electrode plasma device;
   a power supply system including at least a first alternating current (AC) source and a second AC source, the first AC source having a first output frequency and the second AC source having a second output frequency differing from the first output frequency, the first AC source being electrically coupled through a first distribution network to the at least two electrodes, and the second AC source being electrically coupled through a second distribution network to the at least two electrodes,
   the first distribution network comprising:
      a first branching circuit electrically connected to the first AC source, the first branching circuit having at least two branches, each branch of which is connected to a series circuit, each of the series circuits comprising an AC filter circuit and a phase shifter circuit connected in series, each of the AC filter circuits of the first distribution network substantially blocking power transmission at least at the second output frequency, and each of the phase shifter circuits of the first distribution network comprising three fixed-valued reactive elements arranged in a T or π configuration to provide a phase shift of one of the angles: 90°, 270° (=3×90°), 450° (=5×90°) and 630° (=7×90°) for AC power at the first output frequency; and
   the second distribution network comprising:
      a second branching circuit electrically connected to the second AC source, the second branching circuit having at least two branches, each branch of which is connected to a series circuit, each of the series circuits comprising a AC filter circuit and a phase shifter circuit connected in series, each of the AC filter circuits of the second distribution network substantially blocking power transmission at least at the first output frequency, and each of the phase shifter circuits of the second distribution network comprising three fixed-valued reactive elements arranged in a T or π configuration to provide a phase shift of one of the angles: 90°, 270°, 450° and 630° for AC power at the second output frequency, wherein outputs from at least two of the series circuits, whose inputs are connected to the first branching circuit, are electrically connected to a plurality of connection points, including at least one feed to each of the at least two electrodes.

9. The apparatus of claim 8, wherein for a first and a second one of the phase shifter circuits of the first distribution network, a phase shift produced by the first phase shifter circuit and a phase shift produced by the second phase shifter circuit differ by approximately 180°.

10. The apparatus of claim 8, wherein:
the first branching circuit is electrically connected to the first AC source via a first impedance matching network; and
the second branching circuit is electrically connected to the second AC source via a second impedance matching network.

11. The apparatus of claim 8, wherein the phase shifter circuits and RF filter circuits of the first distribution network, and the phase shifter circuits and RF filter circuits of the second distribution network are located on a plurality of PC boards.

12. The apparatus of claim 11, wherein the plurality of PC boards are housed in an air-cooled chassis.

13. A method for providing radio frequency (RF) current to a multi-electrode plasma load, the method comprising:
generating, via a first RF source, a first RF current of a first frequency, and generating, via a second RF source, a second RF current of a second frequency;
passing the first RF current through a first matching network, the first matching network configured to provide impedance matching for the multi-electrode plasma load;
dividing, by a first branching circuit, the first RF current into a first plurality of RF currents;
passing the second RF current through a second matching network, the second matching network configured to provide impedance matching for the multi-electrode plasma load;
dividing, by a second branching circuit, the second RF current into a second plurality of RF currents;
shifting, by a first plurality of phase shifters consisting of reactive elements, a phase of each of the first plurality of RF currents by one of the angles: approximately 90°, 270° (=3×90°), 450° (=5×90°) and 630° (=7×90°);
filtering, by a first plurality of blocking filters, the first plurality of RF currents, the first plurality of blocking filters blocking at least the second frequency;
shifting, by a second plurality of phase shifters consisting of reactive elements, a phase of each of the second plurality of RF currents by one of the angles: approximately 90°, 270°, 450° and 630°;
filtering, by a second plurality of blocking filters, the second plurality of RF signals, the second plurality of blocking filters blocking at least the first frequency; and
coupling the first plurality of RF currents to feed points to two or more electrodes of the multi-electrode plasma load so that respective magnitudes of the first plurality of RF currents to each of the feed points are approximately equal to one another, and coupling the second plurality of RF currents to the feed points to the two or more electrodes of the multi-electrode plasma load so that respective magnitudes of the second plurality of RF currents to each of the feed points are approximately equal to one another.

14. The method of claim 13, wherein respective phases of any two of the RF currents from the first plurality of RF currents differ by one of the angles: 0° and 180°.

15. The method of claim 13, wherein the first plurality of blocking filters blocks a harmonic of the first frequency and blocks the second frequency.

16. The method of claim 13, wherein the second plurality of blocking filters blocks an RF signal at a first frequency that is propagated from the multi-electrode plasma load, and blocks a harmonic of the second frequency.

* * * * *